United States Patent [19]

Vives

[11] Patent Number: 4,461,860

[45] Date of Patent: Jul. 24, 1984

[54] CONDUCTIVE POLYMER COMPOSITION

[75] Inventor: Van C. Vives, Bartlesville, Okla.

[73] Assignee: Phillips Petroleum Company, Bartlesville, Okla.

[21] Appl. No.: 483,012

[22] Filed: Apr. 7, 1983

[51] Int. Cl.³ .............................................. C08K 3/04
[52] U.S. Cl. .................................... 524/80; 524/441; 525/537
[58] Field of Search ................... 525/537; 524/441, 80

[56] References Cited

U.S. PATENT DOCUMENTS 4,148,966 4/1979 Davies ................................. 428/411
4,237,156 12/1980 Boultinghouse ..................... 428/411
4,251,575 2/1981 Brady et al. ......................... 528/388
4,269,738 5/1981 Pez et al. ............................. 252/500

OTHER PUBLICATIONS

C & EN, Mar. 31, (1980), p. 36.
J. Chem. Soc. Chem. Comm., pp. 578–580 (1977).
J. Am. Chem. Soc. 100, 1013–1015 (1978).

*Primary Examiner*—Melvyn I. Marquis

[57] ABSTRACT

Electrical conductivity of a polymeric material such as poly(phenylene sulfide) is enhanced by exposure to iodine vapor in the presence, optionally, of aluminum.

25 Claims, No Drawings

CONDUCTIVE POLYMER COMPOSITION

This invention relates to electrically conductive polymers. It further relates to a method for preparing an electrically conductive poly(arylene sulfide) film.

Commercial uses for electrically-conductive polymers and polymer compounds are increasing. Compositions having moderate conductivity ($10^{-12}$ to $10^{-8}$ ohm$^{-1}$ cm$^{-1}$) are used where electrostatic discharge is important, such as in the computer and electronics industries. Semiconductive polymers ($10^{-7}$ to $10^{0}$ ohm$^{-1}$ cm$^{-1}$) are being developed for use in p-n junction devices, such as solar cells.

It is known that some thermoplastic polymers can be made electrically conductive by doping with a chemical agent. For example, electrical conductivity can be imparted to poly(phenylene sulfide) by doping the polymer with arsenic pentafluoride. Toxicity and stability would be considerations in the development of such a material, but the experiment suggests the potential for making this commercially-important material electrically conductive.

It is therefore an object of the invention to provide an electrically-conductive polymer. It is a further object to provide an article of manufacture comprising an electrically-conductive polymer. In a specific embodiment, it is an object of the invention to provide semiconductive or conductive poly(phenylene sulfide).

BRIEF DESCRIPTION OF THE INVENTION

According to the invention, conductivity of a polymeric material is increased by exposure of the polymeric material to iodine vapor. The polymer can be a thermoplastic such as a poly(arylene sulfide) or a polysulfone. The vapor treatment is carried out under conditions suitable for increasing the electrical conductivity of the polymer, optionally including the presence of aluminum.

DETAILED DESCRIPTION OF THE INVENTION

Any polymeric material which is capable of electrical conductivity with the addition of a doping agent is suitable for the invention composition and method. Highly suitable polymers include poly(arylene sulfide)s and polysulfones. In general, such polymers comprise aromatic moieties having sulfide (—S—) and/or sulfone (SO$_2$) linkages. Examples of such polymers include poly(phenylene sulfide), which can be prepared by the methods of U.S. Pat. Nos. 3,354,129 and 3,919,177, and poly(phenylene sulfide/sulfone), which can be produced by reacting a sulfur source, such as sodium sulfide, sodium hydrosulfide or hydrogen sulfide, with a polyhaloaromatic compound such as p-dichlorobenzene and bis(p-dichorophenyl) sulfone, in the presence of N-methylprrolidone solvent, a carboxylate salt and, if H$_2$S is employed as the sulfur source, sodium hydroxide. Also suitable are poly(phenylene sulfide/ketone)s, which can be produced, for example, by reacting a sulfur source such as sodium sulfide with dichlorobenzophenone in N-methylpyrrolidone solvent in the presence of sodium hydroxide.

The polymeric material selected is exposed to iodine vapor under conditions suitable for increasing the electrical conductivity of the polymer. The length of time over which the iodine treatment is continued can vary widely depending upon the degree of conductivity desired. For mild, near-ambient conditions of about 20° C. to about 60° C., preferably 40° to 55° C., a time of from about 24 hours to one month, generally about 2 days to about 2 weeks, can be used, but this can be longer or shorter depending upon the conditions.

The iodine vapor can be that which is produced upon solid sublimation or upon heating of solid iodine. The contacting is preferably under conditions ensuring the intimate, continuous exposure of the surface to iodine vapor. The contacting should thus be carried out in an enclosed chamber containing the polymer.

Optionally, the method involves the additional exposure of the iodine-treated surface to aluminum, preferably simultaneously with iodine exposure. This can be conveniently carried out, for example, by contacting the polymeric article to be treated with aluminum in the form of foil, pellets, powder and the like. Such an adjuvant treatment method has been found particularly effective in increasing the conductivity of poly(phenylene sulfide/sulfone).

The invention method is effective in significantly increasing the electrical conductivity of the treated polymer. The conductivity of untreated poly(phenylene sulfide) and poly(phenylene sulfide/sulfone) varies with the particular sample, but will generally fall in the proximity of $6-7 \times 10^{-12}$ ohm$^{-1}$ cm$^{-1}$. Treatment according to the invention method can be expected to increase the conductivity to a degree which, of course, depends upon the specifics of the treatment used. Such treatment will generally be expected to increase conductivity (ohm$^{-1}$ cm$^{-1}$) by a factor of $10^2$, preferably $10^3$, and most preferably $10^4$, so that the conductivity following treatment is at least about $6 \times 10^{-7}$.

Treatment with iodine and, optionally, aluminum would, under suitable conditions, increase the conductivity of the polymer into the semiconductive or even the conductive range.

It is believed that greater conductivity increases can be expected from treatment methods in which the aluminum is contacted by the iodine during the treatment process.

The resulting composition comprising an iodine-doped poly(arylene sulfide) with optional aluminum constituent is useful for producing processable semiconductive and conductive articles such as circuit boards.

EXAMPLE I

This example describes the preparation of the invention compositions and films.

Powdered polyphenylene sulfide (PPS) (MR03 from Phillips Petroleum Company, melt flow 20–65 g/10 min at 316° C. at 5 Kg load as measured by ASTM D-1238) was dried in a vacuum oven at 110° C. overnight and was then evenly spread into a thin 4-inch by 4-inch picture frame mold. The PPS was compression molded between two pieces of aluminum foil at 315° C. for 6–10 minutes at 35,000 psi ram force. The frame, foil and contents were removed hot and were allowed to cool slowly to room temperature to give a transparent film 4 inches by 4 inches by about 0.06 centimeters. The film was placed on a piece of aluminum foil, and film and foil were then put in a dessicator containing a dish of iodine crystals.

The dessicator was closed and allowed to stand at room temperature for 1.5 weeks, after which it was kept for 3 days in an oven heated to 40°–55° C.

The film sample was tested for conductivity by placing a 0.5 inch wide strip of film lengthwise across two strip terminals 0.5 inch apart connected to a 45-volt cell battery. The current and voltage across the film sample were determined with a Keithley Electrometer, Model 610C. From the measurements obtained, a conductivity of $7.4 \times 10^{-8}$ ohms$^{-1}$ cm$^{-1}$ was calculated using the formula $$\sigma_V = (1/\rho_s t)$$

where $\sigma_V$ = conductance in ohms$^{-1}$ cm$^{-1}$
$\rho_s$ = surface resistivity in ohms/square
t = film thickness, cm., and $$\rho_s = (R \cdot W/l)$$

where

R = (measured voltage/measured amperage)
W = film width in cm.
l = film length in cm.

EXAMPLE II

This example demonstrates the operability of the invention. The procedure described in Example I was repeated except that the PPS polymer was replaced with another, similar polymer, poly(p-phenylene sulfide/sulfone) (PPSS). The method for preparation of PPSS is described in U.S. Pat. No. 4,102,875. The measurements and calculations described above were made, and a conductivity of $5.3 \times 10^{-7}$ ohm$^{-1}$ cm$^{-1}$ was calculated.

EXAMPLE III

Several control runs were done using both PPS and PPSS polymers. In one run, the conductivities were obtained from polymers on which no post-treatments were made. In another run, the polymers were subjected to iodine vapors for two weeks at 25° C. In a third run, aluminum powder was incorporated into PPS and tested. Incorporation was accomplished by dry blending 48.5 grams of PPS (uncured resin, flow rate 20-65 g/10 min. with a 5 Kg weight at 316° C.; modified ASTM D-1238, procedure B) and 1.5 g purified aluminum powder (Mallinckrodt Chem. Co.). The mixture was then compression molded in a frame with aluminum foil backing, into 4 inch×4 inch×0.017 cm. film and quenched in ice water. The aluminum foil retainer was removed, and the surface was washed with ethanol and dried. A fourth run was made using the aluminum powder-PPS film which was additionally exposed to iodine vapor. The results for the various runs are shown in Table I.

The results suggest that exposure of PPS or PPSS film to aluminum foil plus iodine vapor permits the attainment of conductance values generally better than films not treated with this technique. Film having $10^{-12}$ to $10^{-8}$ ohm$^{-1}$ cm$^{-1}$ conductivity were considered moderately conductive and useful where electronic discharge is important, such as in the computer and electronic industries. Compositions having $10^{-7}$ to $10^{0}$ ohm$^{-1}$ cm$^{-1}$ conductivity were considered semi-conductive and useful in applications such as solar cells.

TABLE I

Effect of Aluminum Foil Plus Iodine Vapor on the Conductivity of PPS[a] and PPSS[b] Film

| Treatment | Conductivity, ohm$^{-1}$ cm$^{-1}$ | |
|---|---|---|
| | PPS[a] | PPSS[b] |
| 1. None | $5.9 \times 10^{-12}$ | $6.7 \times 10^{-12}$ |
| 2. Iodine Vapor | $2.4 \times 10^{-12}$ | $1 \times 10^{-8}$ |
| 3. 3 wt. % Aluminum Powder | $1.3 \times 10^{-11}$ | — |
| 4. 3 wt. % Aluminum Powder plus Iodine Vapor | $3.9 \times 10^{-11}$ | — |
| 5. Aluminum Foil plus Iodine Vapor | $7.4 \times 10^{-8}$ | $5.3 \times 10^{-7}$ |

[a] A Ryton ® poly(phenylene sulfide) injection molding grade polymer, melt flow 20-65 g/10 min. at 316° C. at 5 Kg load, available from Phillips Petroleum Company.
[b] U.S. Pat. No. 4,102,875.

I claim:

1. A method for increasing the electrical conductivity of a poly(arylene sulfide) comprising exposing the poly(arylene sulfide) to iodine vapor for a time sufficient to increase the electrical conductivity of the poly(arylene sulfide).
2. The method of claim 1 in which the exposure to iodine vapor is carried out in the presence of aluminum foil.
3. The method of claim 2 in which the poly(arylene sulfide) comprises poly(phenylene sulfide).
4. The method of claim 1 in which the poly(arylene sulfide) comprises at least two different aromatic moieties joined by sulfide linkages.
5. The method of claim 1 in which the poly(arylene sulfide) comprises poly(phenylene sulfide/sulfone).
6. The method of claim 5 in which the poly(phenylene sulfide/sulfone) is the product of reacting a sulfur source with a mixture of polyhaloaromatic compounds comprising bis(p-chlorophenyl) sulfone.
7. The method of claim 1 in which the poly(arylene sulfide) is exposed to iodine vapor for a time of from about 24 hours to about 1 month at a temperature of about 20° C. to about 60° C.
8. The method of claim 1 in which the poly(arylene sulfide) is exposed to iodine vapor for a time of about 2 days to about 2 weeks.
9. The method of claim 1 in which the exposure to iodine vapor is carried out under conditions effective for increasing the electrical conductivity of the poly(arylene sulfide).
10. The method of claim 1 in which the exposure to iodine vapor is carried out under conditions effective for increasing the electrical conductivity to at least about $1.0 \times 10^{-8}$ ohm$^{-1}$ cm$^{-1}$.
11. The method of claim 1 in which the exposure to iodine vapor is carried out under conditions effective for increasing the electrical conductivity to at least about $1.0 \times 10^{-2}$ ohm$^{-1}$ cm$^{-1}$.
12. The method of claim 2 in which the aluminum is in contact with a surface of the poly(arylene sulfide) being treated.
13. A method comprising passing an electric current through poly(arylene sulfide) treated by the method of claim 1.
14. An article of manufacture comprising electrically conductive poly(arylene sulfide) treated according to the method of claim 1.
15. A composition comprising a poly(arylene sulfide) and iodine.
16. The composition of claim 15 further comprising aluminum.

17. The composition of claim 15 comprising a poly(arylene sulfide) and iodine, the composition having a conductivity of at least about $1.0 \times 10^{-8}$ ohm$^{-1}$ cm$^{-1}$.

18. The composition of claim 15 comprising a poly(arylene sulfide) and iodine, the composition having a conductivity of at least about $1.0 \times 10^{-2}$ ohm$^{-1}$ cm$^{-1}$.

19. The composition of claim 15 in which the iodine is present in an amount effective for increasing the electrical conductivity of the poly(arylene sulfide).

20. The composition of claim 16 in which the iodine and aluminum are present in a collective amount effective for increasing the electrical conductivity of the poly(arylene sulfide).

21. The product of the process of claim 1.
22. The product of the process of claim 2.
23. The product of the process of claim 5.
24. The product of the process of claim 9.
25. The method of claim 1 in which the poly(arylene sulfide) is a poly(arylene sulfide/ketone).

* * * * *